United States Patent
Ozawa et al.

(10) Patent No.: US 10,782,609 B2
(45) Date of Patent: Sep. 22, 2020

(54) PHOTOMASK BLANK AND PHOTOMASK

(71) Applicant: SHIN-ETSU CHEMICAL CO., LTD., Tokyo (JP)

(72) Inventors: Ryoken Ozawa, Joetsu (JP); Takuro Kosaka, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 233 days.

(21) Appl. No.: 15/991,359

(22) Filed: May 29, 2018

(65) Prior Publication Data

US 2019/0004420 A1    Jan. 3, 2019

(30) Foreign Application Priority Data

Jun. 29, 2017 (JP) ................. 2017-127637

(51) Int. Cl.
| | | |
|---|---|---|
| *G03F 1/32* | (2012.01) | |
| *G03F 1/54* | (2012.01) | |
| *G03F 1/58* | (2012.01) | |
| *G03F 1/50* | (2012.01) | |
| *H01L 21/033* | (2006.01) | |

(52) U.S. Cl.
CPC ............... *G03F 1/32* (2013.01); *G03F 1/50* (2013.01); *G03F 1/54* (2013.01); *G03F 1/58* (2013.01); *H01L 21/0337* (2013.01)

(58) Field of Classification Search
CPC ..... G03F 1/32; G03F 1/50; G03F 1/54; G03F 1/58

USPC .......................................................... 430/5
See application file for complete search history.

(56) References Cited

U.S. PATENT DOCUMENTS

2013/0095415 A1    4/2013 Nam et al.

FOREIGN PATENT DOCUMENTS

JP    2012-32823 A    2/2012

OTHER PUBLICATIONS

European Search Report for Appl. No. 18176359.0 dated Oct. 12, 2018.

*Primary Examiner* — Christopher G Young
(74) *Attorney, Agent, or Firm* — Birch, Stewart, Kolasch & Birch, LLP

(57) ABSTRACT

A photomask blank for an exposure light of ArF excimer laser, including a transparent substrate and a light-shielding film containing molybdenum, silicon, and nitrogen. The light-shielding film is formed in a single layer or a multilayer composed of a single composition layer or a composition gradient layer, a reflectance of the light-shielding film on a side remote from the substrate is 40% or less, and among the refractive indexes at the surfaces on the substrate side and the side remote from the substrate of all layers, a difference between the highest and lowest refractive indexes is 0.2 or less, and among the extinction coefficients at the surfaces, a difference between the highest and lowest extinction coefficients is 0.5 or less. The light-shielding film assumes a satisfactory and undeteriorated sectional shape of a mask pattern in an etching process in mask processing or defect correcting.

22 Claims, 2 Drawing Sheets

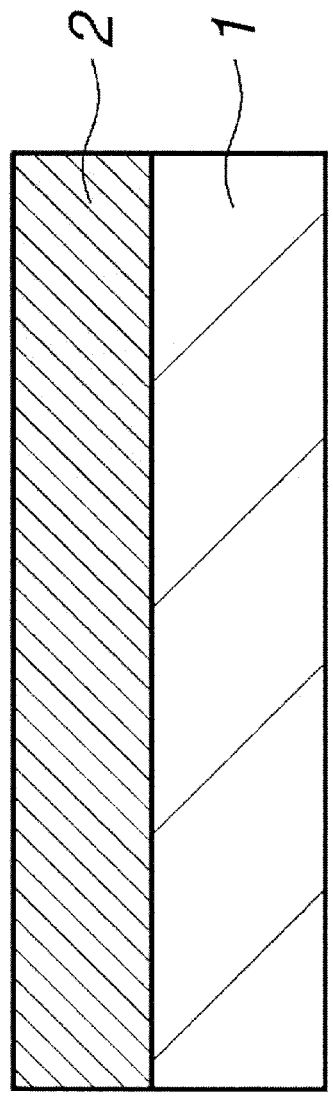

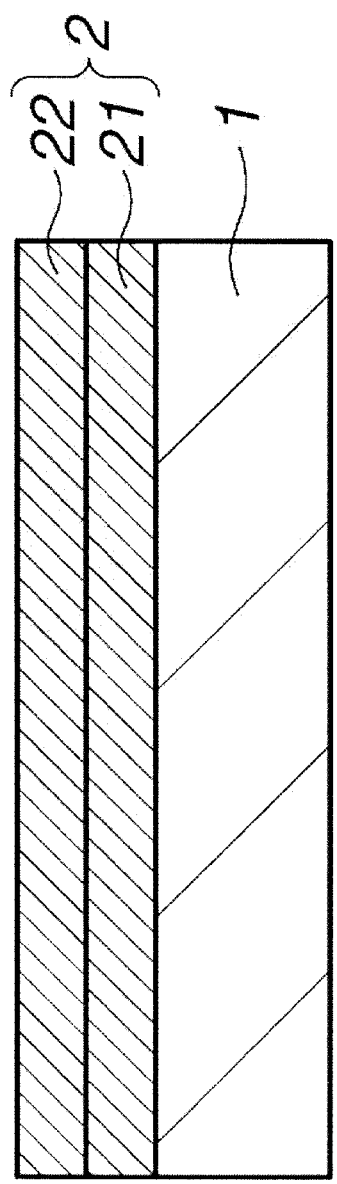

PHOTOMASK BLANK AND PHOTOMASK

CROSS-REFERENCE TO RELATED APPLICATION

This non-provisional application claims priority under 35 U.S.C. § 119(a) on Patent Application No. 2017-127637 filed in Japan on Jun. 29, 2017, the entire contents of which are hereby incorporated by reference.

TECHNICAL FIELD

The invention relates to a photomask blank serving as a material of a photomask used for fine processing of a semiconductor integrated circuit and the like, and relates to the photomask.

BACKGROUND ART

As for a semiconductor integrated circuit used for various applications, to improve the degree of integration and reduce power consumption, finer circuit design has been performed. Accordingly, also in a lithography technique using a photomask for forming a circuit, development of a microfabrication technique has been progressed from a 45 nm node to a 32 nm node, further to a 20 nm or less node. To obtain a finer image, an exposure light source having a shorter wavelength comes into use, and in the current most advanced actual working process, ArF Excimer laser light (193 nm) is used for the exposure light source. Further, to obtain a finer image, a high-resolution technique makes progress, and liquid immersion exposure, deformed illumination, auxiliary pattern, and the like are used. As for a photomask used in photolithography, other than a binary photomask including a translucent part and a light-shielding part, as a phase shift type photomask utilizing interference of light, a halftone phase shift mask, a Levenson type phase shift mask, a chromeless type phase shift mask, and the like have been developed.

The photomask blank used as a material of such a photomask is provided with an inorganic film, such as a light-shielding film that shields exposure light and a phase shift film that changes a phase of the exposure light, on a transparent substrate transmitting the exposure light. The photomask is produced by patterning the inorganic film, such as the light-shielding film and phase shift film, formed on the photomask blank. As the inorganic film, for example, as the light-shielding film, generally a chromium-based film containing chromium or a molybdenum/silicon-based film containing molybdenum and silicon is used.

CITATION LIST

Patent Document 1: JP-A 2012-32823

SUMMARY OF THE INVENTION

Generally, a MoSi-based light-shielding film includes an antireflection layer for reducing reflectance and a light-shielding layer for ensuring a predetermined OD (optical density). In this case, to suppress reflection of light in exposure using a mask, an antireflection layer having a higher degree of oxidation or nitridation is provided on the light-shielding layer. However, in such the antireflection layer, binding properties of N, O, and Si are high, and thus the layer has a slow etching rate. On the other hand, the light-shielding layer containing a large amount of unbonded Si has a fast etching rate. Therefore, when a laminated product of the both layers is etched, a level difference is generated between the both layers, and in an extreme example, an undercut is generated. Further, when a transparent substrate is processed, a difference in the etching rate is generated between the antireflection layer and the light-shielding layer, and thus a sectional shape of a mask pattern deteriorates in an etching process in mask processing or defect correcting.

Particularly, in the generation of 20 nm or less node using ArF excimer laser light of 193 nm, roughness has a significant influence on the line width, for example, a difference in the etching rate is generated at the interface between the antireflection layer and the light-shielding layer, and thus the sectional shape of a mask pattern deteriorates and the roughness becomes large. In an extreme example, if the antireflection layer is peeled off, there occurs a problem that a desired pattern is not obtained. Meanwhile, form the point of view of mask processing or exposure, a thinner film is preferable. However, if a film is thinned, a reflectance becomes high to increase influence of reflected light in exposure, and thus the reflectance needs to be suppressed to some extent.

An object of the invention is to provide a photomask blank having a MoSi-based light-shielding film and a photomask, the MoSi-based light-shielding film ensuring a necessary reflectance and having a satisfactory and undeteriorated sectional shape of a mask pattern in an etching process in mask processing or defect correcting.

The present inventors have found that in a photomask blank which includes a transparent substrate and a light-shielding film and in which exposure light is ArF excimer laser light, in a configuration in which the light-shielding film contains molybdenum, silicon, and nitrogen, and a reflectance to the exposure light of the light-shielding film on a side remote from the substrate is 40% or less, the light-shielding film is formed in a single layer or a multilayer consisting of two or more layers, the layer is composed of a single composition layer having a constant composition in a thickness direction or a composition gradient layer having a continuously varying composition in the thickness direction, and in a case where the light-shielding film is a single layer composed of the composition gradient layer in which the composition continuously varies in the thickness direction, a difference of refractive indexes n to the exposure light between a surface on the substrate side and a surface on a side remote from the substrate is 0.2 or less and a difference of extinction coefficients k to the exposure light between a surface on the substrate side and a surface on a side remote from the substrate is 0.5 or less, on the other hand in a case where the light-shielding film is a multilayer, among the refractive indexes n to the exposure light at the surface on the substrate side and at the surface on the side remote from the substrate of all layers of the multilayer, a difference between the highest refractive index n and the lowest refractive index n is 0.2 or less, and among the extinction coefficients k to the exposure light at the surface on the substrate side and at the surface on the side remote from the substrate of all layers of the multilayer, a difference between the highest extinction coefficient k and the lowest extinction coefficient k is 0.5 or less. Thereby, there can be provided a photomask blank having, as a MoSi-based light-shielding film, the light-shielding film having a satisfactory and undeteriorated sectional shape of a mask pattern and a photomask in an etching process in mask processing or defect correcting, and have achieved the invention.

In one aspect, the invention is to provide a photomask blank including:

a transparent substrate; and a light-shielding film containing molybdenum, silicon, and nitrogen, wherein exposure light is ArF excimer laser light, the light-shielding film is formed in a single layer or a multilayer consisting of two or more layers, the layer is composed of a single composition layer having a constant composition in a thickness direction or a composition gradient layer having a continuously varying composition in the thickness direction, a reflectance to the exposure light of the light-shielding film on a side remote from the substrate is 40% or less, in a case where the light-shielding film is a single layer composed of the composition gradient layer in which the composition continuously varies in the thickness direction, a difference of refractive indexes n to the exposure light between a surface on the substrate side and a surface on a side remote from the substrate is 0.2 or less and a difference of extinction coefficients k to the exposure light between a surface on the substrate side and a surface on a side remote from the substrate is 0.5 or less, and in a case where the light-shielding film is a multilayer, among the refractive indexes n to the exposure light at the surface on the substrate side and at the surface on the side remote from the substrate of all layers of the multilayer, a difference between the highest refractive index n and the lowest refractive index n is 0.2 or less, and among the extinction coefficients k to the exposure light at the surface on the substrate side and at the surface on the side remote from the substrate of all layers of the multilayer, a difference between the highest extinction coefficient k and the lowest extinction coefficient k is 0.5 or less.

In a preferred embodiment, the light-shielding film is a single layer composed of the single composition layer in which the composition is constant in the thickness direction, the refractive index n of the light-shielding film to the exposure light is 2.3 or less and the extinction coefficient k to the exposure light is 1.3 or more, and the thickness of the light-shielding film is 80 nm or less.

In a preferred embodiment, the light-shielding film is a single layer composed of the composition gradient layer in which the composition continuously varies in the thickness direction, in the light-shielding film, the refractive index n at the surface on the substrate side is lower than the refractive index n at the surface on the side remote from the substrate, and the extinction coefficient k at the surface on the substrate side is higher than the extinction coefficient k at the surface on the side remote from the substrate. Typically, the refractive index n of the light-shielding film to the exposure light is 2.3 or less and the extinction coefficient k to the exposure light is 1.3 or more, and the thickness of the light-shielding film is 80 nm or less.

In a preferred embodiment, the light-shielding film is a multilayer, in the light-shielding film, the refractive index n of a layer on a side closest to the substrate is lower than the refractive index n at a layer on a side remotest from the substrate, and the extinction coefficient k of the layer on the side closest to the substrate is higher than the extinction coefficient k of the layer on the side remotest from the substrate. Typically, i) the multilayer is composed of only the single composition layer in which the composition is constant in the thickness direction, ii) in the light-shielding film, the refractive index n at the face closest to the substrate is the lowest, and the layer closest to the substrate has the highest extinction coefficient k and has a thickness of 50 nm or less, or iii) any of the refractive indexes n is 2.3 or less and any of the extinction coefficients k is 1.3 or more, and the thickness of the light-shielding film is 80 nm or less.

In a preferred embodiment, in any of the compositions of respective layers of the light-shielding film, the total content of molybdenum and silicon is 55 to 75 atom %, the content of nitrogen is 25 to 45 atom %, and the ratio of molybdenum to the total of molybdenum and silicon is 20 atom % or less.

In a preferred embodiment, the light-shielding film is formed in contact with the substrate and an optical density OD with respect to a wavelength of the exposure light is 2.8 or more, or the light-shielding film is formed on the substrate with one or two or more of other films interposed, and the optical density OD of the whole of the light-shielding film and the other films with respect to the wavelength of the exposure light is 2.8 or more. Typically, the other films include only an etching stopper film having an etching characteristic different from that of the light-shielding film, only a phase shift film having an etching characteristic same as that of the light-shielding film, or both of the etching stopper film and the phase shift film.

In a preferred embodiment, the photomask blank including a hard mask film having an etching characteristic different from that of the light-shielding film in contact with the light-shielding film on a side remote from the substrate.

In another aspect, the invention is to provide a photomask produced by using the photomask blank.

Advantageous Effects of the Invention

There can be provided a photomask blank and a photomask having, as a MoSi-based light-shielding film, the light-shielding film assuming a satisfactory and undeteriorated sectional shape of a mask pattern in an etching process in mask processing or defect correcting.

BRIEF DESCRIPTION OF THE DRAWINGS

FIG. 1 is a cross-sectional view showing one example of a photomask blank of the invention.

FIG. 2 is a cross-sectional view showing another example of the photomask blank of the invention.

DESCRIPTION OF THE PREFERRED EMBODIMENT

A photomask blank of the invention includes a transparent substrate (a substrate transparent to exposure light) and a light-shielding film containing molybdenum, silicon, and nitrogen. The photomask blank and a photomask of the invention use ArF excimer laser light (wavelength of 193 nm) as the exposure light (light used for exposure using the photomask).

As the transparent substrate, although a type and a size of the substrate are not particularly limited, a quartz substrate that is transparent with respect to a wavelength used as an exposure wavelength is applied, and for example, a transparent substrate called a 6025 substrate of 6-inch square and 0.25-inch thick as specified in SEMI standard is preferable. The 6025 substrate is also written as a transparent substrate of 152-mm square and 6.35-mm thick in SI units.

The light-shielding film is composed of a single layer or a multilayer (for example, 2 to 10 layers). For example, the photomask blank of a single layer specifically includes, as shown in FIG. 1, a transparent substrate 1 and a light-shielding film 2 formed on the transparent substrate 1, and the photomask blank of a multilayer includes a transparent substrate 1 and a light-shielding film 2 including a first layer 21 and a second layer 22 that is formed on the transparent substrate 1 from the transparent substrate 1 side in the sequence. In a case of the light-shielding film composed of a single layer, the light-shielding film may be a single composition layer in which the composition is constant in the thickness direction or a composition gradient layer in which the composition continuously varies in the thickness direction. Meanwhile, in a case of the light-shielding film composed of a multilayer, the light-shielding film is composed of two or more layers selected from a single composition layer in which the composition is constant in the thickness direction and a composition gradient layer in which the composition continuously varies in the thickness direction, and may be any of a combination of only the single composition layers, a combination of only the composition gradient layers, and a combination of the single composition layer and the composition gradient layer. The composition gradient layer may be a layer in which constituent elements increase or decrease in the thickness direction, but from the viewpoint of decreasing a reflectance to the exposure light of the light-shielding film on the side remote from the transparent substrate, composition gradient in which the content of nitrogen increases toward the direction remote from the transparent substrate is preferable.

The light-shielding film contains molybdenum, silicon, and nitrogen. The material of the light-shielding film specifically includes a molybdenum silicon nitride (MoSiN) consisting of molybdenum, silicon, and nitrogen, and a molybdenum silicon nitrogen compound consisting of molybdenum, silicon, nitrogen, and one or both of oxygen and carbon such as a molybdenum silicon nitride oxide (MoSiNO), a molybdenum silicon nitride carbide (MoSiNC), and a transition metal silicon nitride oxide carbide (MoSiNOC).

In any of compositions of respective layers of the light-shielding film, the total content of molybdenum and silicon is preferably 55 atom % or more, particularly 60 atom % or more and 75 atom % or less, particularly 70 atom % or less. In addition, in any of compositions of respective layers of the light-shielding film, the content of nitrogen is preferably 25 atom % or more, particularly 28 atom % or more, especially 30 atom % or more and 45 atom % or less, particularly 35 atom % or less. Further, in any of compositions of respective layers of the light-shielding film, the ratio of molybdenum to the total of molybdenum and silicon is preferably 20 atom % or less, particularly 18 atom % or less. The ratio of molybdenum to the total of molybdenum and silicon is normally 10 atom % or more.

The reflectance to the exposure light of the light-shielding film on the side remote from the transparent substrate is 40% or less, and the reflectance is preferably 38% or less, particularly 35% or less. In the light-shielding film of the invention, particularly, the nitrogen content is increased, thereby suppressing the reflectance to the exposure light of the light-shielding film on the side remote from the transparent substrate to 40% or less, particularly 38% or less, especially 35% or less, while ensuring the optical density OD that is a light-shielding performance required for the photomask blank, and occurrence of a ghost pattern is prevented. In addition, lowering the content ratio of molybdenum improves environmental tolerance, washability, and laser irradiation resistance.

In a case where the light-shielding film is composed of a single layer, in the layer, or in a case where the light-shielding film is composed of a multilayer, in any of the layers, the refractive index of the light-shielding film to the exposure light is preferably 2.3 or less, particularly 2.2 or less. In a case where the light-shielding film is composed of a single layer, in the layer, or in a case where the light-shielding film is composed of a multilayer, in any of the layers, the extinction coefficient k of the light-shielding film to the exposure light is preferably 1.3 or more, particularly 1.5 or more. As the refractive index is lower, the reflectance can be reduced more, and as the extinction coefficient k is larger, the optical density OD per unit film thickness can be increased, that is, the film thickness can be reduced more. As for the thickness of the light-shielding film (the thickness of entire light-shielding film), taking into consideration reduction of a three-dimensional effect and shortening of required time in pattern formation, the thinner thickness is better, and the thickness is preferably 80 nm or less, more preferably 60 nm or less. The thickness of the light-shielding film (the thickness of entire light-shielding film) is not particularly limited, but normally 40 nm or more.

The light-shielding film, in a case where it is a single layer composed of a single composition layer having a constant composition in a thickness direction, is advantageous in that the sectional shape of the mask pattern after etching is satisfactory. Meanwhile, the light-shielding film can be formed into a single layer composed of a composition gradient layer having a continuously varying composition in the thickness direction, but from the viewpoint of ensuring a satisfactory sectional shape of a mask pattern, since the difference of etching rate in the thickness direction of the light-shielding film needs to be made small, the difference of the refractive indexes n to the exposure light between the surface on the transparent substrate side and the surface on a side remote from the transparent substrate is made 0.2 or less, preferably 0.1 or less, and the difference of the extinction coefficients k to the exposure light between the surface on the transparent substrate side and a surface on the side remote from the transparent substrate is made 0.5 or less, preferably 0.2 or less.

In this case, it is preferable that the refractive index n at the surface on the transparent substrate side is lower than that at the surface on the side remote from the transparent substrate, and the extinction coefficient k at the surface on the transparent substrate side is higher than that at the surface on the side remote from the transparent substrate.

In addition, the light-shielding film can be formed into a multilayer composed of two or more layers selected from a single composition layer having a constant composition in a thickness direction and a composition gradient layer having a continuously varying composition in the thickness direction, but also in this case, from the viewpoint of ensuring a satisfactory sectional shape of a mask pattern, since the difference of etching rate in the thickness direction of the light-shielding film needs to be made small, among the refractive indexes n to the exposure light at the surface on the transparent substrate side and at the surface on the side remote from the transparent substrate of all layers of the multilayer, a difference between the highest refractive index n and the lowest refractive index n is made 0.2 or less, preferably 0.1 or less, and among the extinction coefficients k to the exposure light at the surface on the transparent substrate side and at the surface on the side remote from the transparent substrate of all layers of the multilayer, a difference between the highest extinction coefficient k and the lowest extinction coefficient k is made 0.5 or less, preferably 0.2 or less.

In this case, it is preferable that the refractive index n of the layer on the side closest to the transparent substrate is lower than that at the layer on the side remotest from the transparent substrate, and the extinction coefficient k of the layer on the side closest to the transparent substrate is higher than that of the layer on the side remotest from the transparent substrate.

In a case where the light-shielding film is a multilayer, particularly in the light-shielding film, the refractive index n at the surface on the side closest to the transparent substrate (that is, the face of the layer on the side closest to the transparent substrate on the side closest to the transparent substrate) is preferably the lowest. In addition, a layer having the highest extinction coefficient k has a thickness of preferably 50 nm or less, particularly 30 nm or less, especially 10 nm or less and 2 nm or more. The layer having the highest extinction coefficient k is preferably arranged on the side closest to the transparent substrate, and with this arrangement, detection of an endpoint in etching is facilitated. In the layer having the highest extinction coefficient k, for example, the content of molybdenum may be made higher than the other layers, made higher preferably by 1 atom % or more, more preferably by 5 atom % or more.

The light-shielding film may be formed in contact with the transparent substrate or formed on the transparent substrate with one or two or more other films interposed therebetween. In a case where the light-shielding film is formed in contact with the transparent substrate, the optical density OD with respect to a wavelength of the exposure light of the light-shielding film is preferably 2.8 or more, particularly 2.9 or more, especially 3 or more. Meanwhile, in a case where the light-shielding film is formed with the other films, such as a phase shift film and an etching stopper film, interposed between the light-shielding film and the transparent substrate, the optical density OD of the whole of the light-shielding film and the other films (all other films formed between the transparent substrate and the light-shielding film) with respect to the wavelength of the exposure light is preferably 2.8 or more, particularly 2.9 or more, especially 3 or more.

A single layer or each layer of a multilayer of the light-shielding film is preferably formed by a sputtering method by which a film excellent in uniformity can be easily obtained, and any method of DC sputtering and RF sputtering can be used. A target and a sputtering gas are appropriately selected depending on a layer configuration or composition. As the target, a molybdenum target, a target containing silicon, such as a molybdenum-silicide target, a silicon target, a silicon nitride target, and a target containing both of silicon and silicon nitride, may be used. The content of nitrogen can be adjusted by using a gas containing nitrogen as a reactive gas for the sputtering gas and by performing reactive sputtering with the introduction amount appropriately adjusted. As the reactive gas, specifically, a nitrogen gas ($N_2$ gas), a nitrogen oxide gas (NO gas, $N_2O$ gas, $NO_2$ gas) or the like can be used, and further an oxygen gas ($O_2$ gas), a carbon oxide gas (CO gas, $CO_2$ gas) or the like can be used as needed. Further, for the sputtering gas, as a rare gas, an inert gas, such as a helium gas, a neon gas, and an argon gas, can be used, and the argon gas is suitable for the inert gas. The sputter pressure is normally 0.01 Pa or more, particularly 0.03 Pa or more and 10 Pa or less, particularly 0.1 Pa or less.

The photomask blank of the invention may be subjected to heat treatment, which is performed after the formation the light-shielding film, at a temperature, for example, 150° C. or higher, that is higher than the temperature applied in the patterning process for producing a photomask from the photomask blank. An atmosphere of the heat treatment may be an atmosphere of an inert gas, such as a helium gas and an argon gas, may be an oxygen-existing atmosphere, such as an oxygen-gas atmosphere, or may be under vacuum.

In addition, to suppress film quality change of the light-shielding film, a surface oxide layer can be provided as a layer of the outermost surface on the surface side of the light-shielding film (the side remote from the transparent substrate). The oxygen content of the surface oxide layer may be 20 atom % or more, further may be 50 atom % or more. A method for forming the surface oxide layer, specifically, in addition to oxidation by atmospheric oxidation (natural oxidation), a method for active oxidation treatment may include, for example, a method for processing a film of silicon-based material by an ozone gas or an ozone water, a method for heating to 300° C. or more by oven heating, lamp annealing, laser heating, or the like in the oxygen-existing atmosphere, such as an oxygen-gas atmosphere, or a method for forming an oxide film by sputtering or the like. The thickness of the surface oxide layer is preferably 10 nm or less, particularly 5 nm or less, especially 3 nm or less, and normally the thickness of 1 nm or more assures an effect as the oxide film. The surface oxide layer can be formed by increasing an amount of oxygen in the sputtering process, but to form the layer with fewer defects, it is preferably formed by the above-mentioned atmospheric oxidation or oxidation treatment.

The surface oxide layer is formed on the side of the light-shielding film remotest from the transparent substrate. In the case where the light-shielding film is a single layer, the surface oxide layer is formed as a part of the side remotest from the transparent substrate thereof, and in the case where the light-shielding film is a multilayer, it is formed as a part of the side remotest from the transparent substrate of the layer on the side remotest from the transparent substrate. The surface oxide layer is formed as a part of the light-shielding film, the thickness of the surface oxide layer is included in the thickness of the entire light-shielding film, and the entire light-shielding film is a target of the optical density OD. However, the surface oxide layer itself does not need to satisfy features, such as the above-described composition, refractive index, and extinction coefficient k, for layers other than the surface oxide layer.

The photomask blank of the invention can use a binary-type photomask blank in a case where the light-shielding film is formed in contact with the transparent substrate or in a case where the light-shielding film is formed on the transparent substrate with the etching stopper film interposed therebetween. The photomask blank can use a phase shift-type photomask blank in a case where the light-shielding film is formed on the transparent substrate with the phase shift film or the etching stopper film and phase shift film interposed therebetween. In a case where the light-shielding film is formed on the transparent substrate with the etching stopper film and phase shift film, as the other film, interposed therebetween, they may be formed in the order of the etching stopper film and phase shift film or in the order of the phase shift film and etching stopper film from the transparent substrate. A binary-type photomask (binary mask) and a phase shift-type photomask (phase shift mask) can be produced from the binary-type photomask blank and the phase shift-type photomask blank, respectively.

Etching can be accurately controlled by forming the etching stopper film. The etching stopper film may be any film having the etching characteristic different from that of the light-shielding film, and is preferably a film that is resistant to fluorine-based dry etching using a fluorine-based gas applied to etching of material containing silicon and is formed of material capable of being etched by chlorine-based dry etching using a chlorine-based gas (chlorine-oxygen gas) containing oxygen. As such a film, a film of material containing chromium is preferable. The etching stopper film may be composed of a single layer or a multilayer. The material containing chromium specifically includes a chromium metal, and a chromium compound, such as a chromium oxide (CrO), a chromium nitride (CrN), a chromium carbide (CrC), a chromium oxynitride (CrON), a chromium oxide carbide (CrOC), a chromium nitride carbide (CrNC), and a chromium oxide nitride carbide (CrONC).

In a case where the etching stopper film is a film composed of a chromium compound, the content of chromium is preferably 30 atom % or more, particularly 35 atom % or more and less than 100 atom %, particularly 99 atom % or less, especially 90 atom % or less. The content of nitrogen is preferably 50 atom % or less, particularly 40 atom % or less, and preferably 1 atom % or more. The content of oxygen is preferably 60 atom % or less, particularly 55 atom % or less, and preferably 1 atom % or more. The content of carbon is preferably 30 atom % or less, particularly 20 atom % or less, and preferably 1 atom % or more. In this case, the total content of chromium, oxygen, nitrogen, and carbon is preferably 95 atom % or more, particularly 99 atom % or more, especially 100 atom %. The thickness of the etching stopper film is normally 1 nm or more, particularly 2 nm or more and 20 nm or less, particularly 10 nm or less. In addition, the etching stopper film can be made to function as an etching stopper film for the transparent substrate, or also as an etching stopper film for the phase shift film.

The transmittance of the phase shift film is not particularly limited, and even if the transmittance is almost 100%, a halftone phase shift film (for example, the transmittance to the exposure light is 5 to 30%) may be used. The phase shift film is preferably formed of material having the etching characteristic same as that of the light-shielding film, specifically formed of material capable of being etched by fluorine-based dry etching using a fluorine-based gas, and further is more preferably a film formed of material that is resistant to chlorine-based dry etching using a chlorine-based gas (chlorine-oxygen gas) containing oxygen.

The phase shift film may be composed of a single layer or a multilayer. The phase shift film is preferably a film formed of material containing silicon, and the material containing silicon includes, for example, a silicon-containing compound, for example, a silicon-containing compound containing silicon and one or more selected from oxygen and nitrogen, specifically a silicon oxide (SiO), a silicon nitride (SiN), a silicon oxynitride (SiON), or the like, and a transition metal silicon compound, for example, a transition metal silicon compound containing transition metal (Me), silicon, and one or more selected from oxygen, nitrogen, and carbon, specifically a transition metal silicon oxide (MeSiO), a transition metal silicon nitride (MeSiN), a transition metal silicon carbide (MeSiC), a transition metal silicon oxinitride (MeSiON), a transition metal silicon oxide carbide (MeSiOC), a transition metal silicon nitride carbide (MeSiNC), a transition metal silicon oxinitride carbide (MeSiONC), or the like. The suitable transition metal (Me) includes one or more selected from titanium (Ti), vanadium (V), cobalt (Co), nickel (Ni), zirconium (Zr), niobium (Nb), molybdenum (Mo), hafnium (Hf), tantalum (Ta), and tungsten (W), and particularly molybdenum (Mo) is preferable from a point of dry etching workability.

The thickness of the phase shift film is adjusted to a thickness for shifting a phase, with respect to the exposure light when the photomask is used, by a predetermined amount, normally, 150° or more, particularly 170° or more and 200° or less, particularly 190° or less, normally about 180°. Specifically, the suitable thickness is, for example, 50 nm or more, particularly 60 nm or more and 100 nm or less, particularly 80 nm or less.

The photomask blank of the invention may have a hard mask film having an etching characteristic different from that of the light-shielding film, in contact with the light-shielding film on a side remote from the transparent substrate. The hard mask film makes it possible to thin a resist film and to accurately form a finer pattern. The hard mask film functions as an aid film in etching for the light-shielding film and contributes to improvement of density dependence (reduction of loading effect) or the like. The hard mask film is preferably a film that is particularly resistant to fluorine-based dry etching using a fluorine-based gas applied to etching of material containing silicon and is formed of material capable of being etched by chlorine-based dry etching using a chlorine-based gas (chlorine-oxygen gas) containing oxygen. As such a film, a film of material containing chromium is preferable. The hard mask film may be composed of a single layer or a multilayer. The material containing chromium specifically includes a chromium metal, and a chromium compound, such as a chromium oxide (CrO), a chromium nitride (CrN), a chromium carbide (CrC), a chromium oxynitride (CrON), a chromium oxide carbide (CrOC), a chromium nitride carbide (CrNC), and a chromium oxide nitride carbide (CrONC).

In a case where the hard mask film is a film composed of a chromium compound, the content of chromium is preferably 30 atom % or more, particularly 35 atom % or more and less than 100 atom %, particularly 99 atom % or less, especially 90 atom % or less. The content of nitrogen is preferably 50 atom % or less, particularly 40 atom % or less, and preferably 1 atom % or more. The content of oxygen is preferably 60 atom % or less, particularly 40 atom % or less, and preferably 1 atom % or more. The content of carbon is preferably 30 atom % or less, particularly 20 atom % or less, more preferably 1 atom % or more. In this case, the total content of chromium, oxygen, nitrogen, and carbon is preferably 95 atom % or more, particularly 99 atom % or more, especially 100 atom %. The thickness of the hard mask film is normally 1 nm or more, particularly 2 nm or more and 30 nm or less, particularly 20 nm or less. The hard mask film may be completely removed after pattern formation of the light-shielding film, or may be left partially or wholly after pattern formation to function as a film for compensating a light-shielding property or as a conductive film. The photomask blank of the invention may include both of the etching stopper film and the hard mask film.

A film composed of material containing chromium can be formed by reactive sputtering with using, for example, a chromium target or a target composed of chromium with adding any one or two or more selected from oxygen, nitrogen, and carbon, and a sputtering gas containing a rare gas (an inert gas), such as a helium gas, a neon gas, and an argon gas, with appropriately adding a reactive gas selected from, for example, an oxygen-containing gas, a nitrogen-containing gas, and a carbon-containing gas according to a composition of a film to be formed.

A film composed of material containing silicon can be formed by reactive sputtering with using a target selected from, for example, a silicon target, a transition metal target, a transition metal silicon target, and a sputtering gas containing a rare gas (an inert gas), such as a helium gas, a neon gas, and an argon gas, with appropriately adding a reactive gas selected from, for example, an oxygen-containing gas, a nitrogen-containing gas, and a carbon-containing gas according to a composition of a film to be formed.

The phase shift-type photomask blank, for example, includes a phase shift-type photomask blank including a phase shift film and a light-shielding film, sequentially formed on a transparent substrate, a phase shift-type photomask blank including a phase shift film, a light-shielding film and a hard mask film, sequentially formed on a transparent substrate, a phase shift-type photomask blank including a phase shift film, an etching stopper film and a light-shielding film, sequentially formed on a transparent substrate, and a phase shift-type photomask blank including a phase shift film, an etching stopper film, a light-shielding film and a hard mask film, sequentially formed on a transparent substrate.

A photomask of the invention uses the photomask blank and can be produced by a common procedure. For example, in a case of a binary-type photomask, it can be produced by the following processes. First, onto a light-shielding film of a binary-type photomask blank in which the light-shielding film is formed on the transparent substrate in contact with the transparent substrate, a resist, such as a chemical amplification-type resist, is applied to form a resist film, and the resist film is drawn with an electron beam or the like and then developed to form a predetermined resist pattern. Then, with the resist pattern as an etching mask, the light-shielding film is patterned by fluorine-based dry etching, and the resist pattern is removed by a common procedure, thus the binary-type photomask is obtained.

EXAMPLES

The invention is specifically explained below with reference to Examples and Comparative Example, but the invention is not limited to Examples described below.

Example 1

The 6025 quartz substrate of 152-mm square and 6.35 mm thick was installed in a chamber of the sputtering device, a MoSi target and a Si target as a sputter target and an argon gas and a nitrogen gas ($N_2$ gas) as a sputtering gas were used, power applied to the MoSi target was set to 150 W, power applied to the Si target was set to 1,850 W, a flow rate of the argon gas was set to 20 sccm, and a flow rate of the nitrogen gas was set to 16 sccm, and a single-layer light-shielding film of a single composition layer composed of a MoSiN and having a constant composition in a thickness direction. Thus, a binary photomask blank was obtained.

The optical density OD to ArF excimer laser light of the light-shielding film was 3.1, the film thickness thereof was 54 nm, and in the composition thereof, the contents of Si, Mo, and N were 62 atom %, 8 atom %, and 30 atom %, respectively. In addition, with respect to the ArF excimer laser light, the refractive index n was 1.7, the extinction coefficient k was 2.0, and the reflectance on the side remote from the quartz substrate was 37%. Next, the light-shielding film was etched in a defect correction device using $XeF_2$ as an etching gas, and then the light-shielding film had a satisfactory sectional shape without leaving an eaves-like portion that was not etched on the outermost layer of the film.

Example 2

The 6025 quartz substrate of 152-mm square and 6.35 mm thick was installed in the chamber of the sputtering device, a MoSi target and a Si target as a sputter target and an argon gas and a nitrogen gas ($N_2$ gas) as a sputtering gas were used, power applied to the MoSi target was set to 300 W, power applied to the Si target was set to 1,850 W, a flow rate of the argon gas was set to 20 sccm, and a flow rate of the nitrogen gas was set to 16 sccm, and a first layer (5 nm thick) of a single composition layer composed of a MoSiN and having a constant composition in a thickness direction was formed and then only the power applied to the MoSi target was changed to 150 W and a second layer (55 nm thick) of the single composition layer composed of a MoSiN and having a constant composition in the thickness direction was formed to form the light-shielding film composed of the two single composition layers each composed of the MoSiN and having a constant composition in the thickness direction. Thus, a binary photomask blank was obtained.

The optical density OD to the ArF excimer laser light of the light-shielding film was 3.2, the film thickness thereof was 57 nm, and in the composition of the first layer, the contents of Si, Mo, and N were 60 atom %, 10 atom %, and 30 atom %, respectively, and in the composition of the second layer, the contents of Si, Mo, and N were 62 atom %, 8 atom %, and 30 atom %, respectively. In addition, with respect to the ArF excimer laser light, the refractive indexes n were 1.7 in the first layer and 1.7 in the second layer, the extinction coefficients k were 2.1 in the first layer and 1.9 in the second layer, and the reflectance on the side remote from the quartz substrate was 37%. Next, the light-shielding film was etched in a defect correction device using $XeF_2$ as an etching gas, and then the light-shielding film had a satisfactory sectional shape without leaving an eaves-like portion that was not etched on the outermost layer of the film.

Comparative Example 1

The 6025 quartz substrate of 152-mm square and 6.35 mm thick was installed in the chamber of the sputtering device, a MoSi target and a Si target as a sputter target and an argon gas and a nitrogen gas ($N_2$ gas) as a sputtering gas were used, power applied to the MoSi target was set to 575 W, power applied to the Si target was set to 1,925 W, a flow rate of the argon gas was set to 20 sccm, and a flow rate of the nitrogen gas was set to 20 sccm, and a first layer (42 nm thick) of a single composition layer composed of a MoSiN and having a constant composition in a thickness direction was formed and then only the flow rate of the nitrogen gas was changed to 70 sccm and a second layer (18 nm thick) of the single composition layer composed of a MoSiN and having a constant composition in the thickness direction was formed to form the light-shielding film composed of the two single composition layers each composed of the MoSiN and having a constant composition in the thickness direction. Thus, a binary photomask blank was obtained.

The optical density OD to the ArF excimer laser light of the light-shielding film was 3.1, the film thickness thereof was 60 nm, and in the composition of the first layer, the contents of Si, Mo, and N were 56 atom %, 17 atom %, and 27 atom %, respectively, and in the composition of the second layer, the contents of Si, Mo, and N were 46 atom %, 10 atom %, and 44 atom %, respectively. In addition, with respect to the ArF excimer laser light, the refractive indexes n were 2.0 in the first layer and 2.2 in the second layer, the extinction coefficients k were 2.0 in the first layer and 0.94 in the second layer, and the reflectance on the side remote from the quartz substrate was 11%. Next, the light-shielding film was etched in a defect correction device using $XeF_2$ as an etching gas, and then the light-shielding film had an eaves-like portion on the side of the second layer remote from the quartz substrate and had a defective sectional shape.

Japanese Patent Application No. 2017-127637 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising:
    a transparent substrate; and
    a light-shielding film comprising molybdenum, silicon, and nitrogen, wherein
    an exposure light is ArF excimer laser light,
    the light-shielding film is formed in a single layer, the layer is composed of a single composition layer having a constant composition in a thickness direction,
    a reflectance to the exposure light of the light-shielding film on a side remote from the substrate is 40% or less, and
    the refractive index n of the light-shielding film to the exposure light is 2.3 or less and the extinction coefficient k to the exposure light is 1.3 or more, and the thickness of the light-shielding film is 80 nm or less.

2. The photomask blank of claim 1, wherein in any of the compositions of respective layers of the light-shielding film, the total content of molybdenum and silicon is 55 to 75 atom %, the content of nitrogen is 25 to 45 atom %, and the ratio of molybdenum to the total of molybdenum and silicon is 20 atom % or less.

3. The photomask blank of claim 1, wherein the light-shielding film is formed in contact with the substrate and an optical density OD with respect to a wavelength of the exposure light is 2.8 or more, or the light-shielding film is formed on the substrate with one or two or more of other films interposed, and the optical density OD of the whole of the light-shielding film and the other films with respect to the wavelength of the exposure light is 2.8 or more.

4. The photomask blank of claim 3, wherein the other films include only an etching stopper film having an etching characteristic different from that of the light-shielding film, only a phase shift film having an etching characteristic same as that of the light-shielding film, or both of the etching stopper film and the phase shift film.

5. The photomask blank of claim 1, comprising a hard mask film having an etching characteristic different from that of the light-shielding film in contact with the light-shielding film on a side remote from the substrate.

6. A photomask produced by using the photomask blank of claim 1.

7. A photomask blank comprising:
    a transparent substrate; and
    a light-shielding film comprising molybdenum, silicon, and nitrogen, wherein
    an exposure light is ArF excimer laser light,
    the light-shielding film is formed in a single layer, the single layer is composed of a composition gradient layer having a continuously varying composition in the thickness direction,
    a reflectance to the exposure light of the light-shielding film on a side remote from the substrate is 40% or less,
    in the light-shielding film, the refractive index n at the surface on the substrate side is lower than the refractive index n at the surface on the side remote from the substrate, and the extinction coefficient k at the surface on the substrate side is higher than the extinction coefficient k at the surface on the side remote from the substrate, and
    a difference of refractive indexes n to the exposure light between a surface on the substrate side and a surface on a side remote from the substrate is 0.2 or less and a difference of extinction coefficients k to the exposure light between a surface on the substrate side and a surface on a side remote from the substrate is 0.5 or less.

8. The photomask blank of claim 7, wherein the refractive index n of the light-shielding film to the exposure light is 2.3 or less and the extinction coefficient k to the exposure light is 1.3 or more, and the thickness of the light-shielding film is 80 nm or less.

9. The photomask blank of claim 7, wherein in any of the compositions of respective layers of the light-shielding film, the total content of molybdenum and silicon is 55 to 75 atom %, the content of nitrogen is 25 to 45 atom %, and the ratio of molybdenum to the total of molybdenum and silicon is 20 atom % or less.

10. The photomask blank of claim 7, wherein the light-shielding film is formed in contact with the substrate and an optical density OD with respect to a wavelength of the exposure light is 2.8 or more, or the light-shielding film is formed on the substrate with one or two or more of other films interposed, and the optical density OD of the whole of the light-shielding film and the other films with respect to the wavelength of the exposure light is 2.8 or more.

11. The photomask blank of claim 10, wherein the other films include only an etching stopper film having an etching characteristic different from that of the light-shielding film, only a phase shift film having an etching characteristic same as that of the light-shielding film, or both of the etching stopper film and the phase shift film.

12. The photomask blank of claim 7, comprising a hard mask film having an etching characteristic different from that of the light-shielding film in contact with the light-shielding film on a side remote from the substrate.

13. A photomask produced by using the photomask blank of claim 7.

14. A photomask blank comprising:
    a transparent substrate; and
    a light-shielding film comprising molybdenum, silicon, and nitrogen, wherein
    an exposure light is ArF excimer laser light,
    the light-shielding film is formed in a multilayer consisting of two or more layers, the layer is composed of a single composition layer having a constant composition in a thickness direction or a composition gradient layer having a continuously varying composition in the thickness direction,
    a reflectance to the exposure light of the light-shielding film on a side remote from the substrate is 40% or less,
    in the light-shielding film, the refractive index n of a layer on a side closest to the substrate is lower than the refractive index n at a layer on a side remotest from the substrate, and the extinction coefficient k of the layer on the side closest to the substrate is higher than the extinction coefficient k of the layer on the side remotest from the substrate, and
    among the refractive indexes n to the exposure light at the surface on the substrate side and at the surface on the side remote from the substrate of all layers of the multilayer, a difference between the highest refractive index n and the lowest refractive index n is 0.2 or less, and among the extinction coefficients k to the exposure light at the surface on the substrate side and at the surface on the side remote from the substrate of all layers of the multilayer, a difference between the highest extinction coefficient k and the lowest extinction coefficient k is 0.5 or less.

15. The photomask blank of claim 14, wherein the multilayer is composed of only the single composition layer in which the composition is constant in the thickness direction.

16. The photomask blank of claim 14, wherein in the light-shielding film, the refractive index n at the face closest to the substrate is the lowest, and the layer closest to the substrate has the highest extinction coefficient k and has a thickness of 50 nm or less.

17. The photomask blank of claim 14, wherein any of the refractive indexes n is 2.3 or less and any of the extinction coefficients k is 1.3 or more, and the thickness of the light-shielding film is 80 nm or less.

18. The photomask blank of claim 14, wherein in any of the compositions of respective layers of the light-shielding film, the total content of molybdenum and silicon is 55 to 75 atom %, the content of nitrogen is 25 to 45 atom %, and the ratio of molybdenum to the total of molybdenum and silicon is 20 atom % or less.

19. The photomask blank of claim 14, wherein the light-shielding film is formed in contact with the substrate and an optical density OD with respect to a wavelength of the exposure light is 2.8 or more, or the light-shielding film is formed on the substrate with one or two or more of other films interposed, and the optical density OD of the whole of the light-shielding film and the other films with respect to the wavelength of the exposure light is 2.8 or more.

20. The photomask blank of claim 19, wherein the other films include only an etching stopper film having an etching characteristic different from that of the light-shielding film, only a phase shift film having an etching characteristic same as that of the light-shielding film, or both of the etching stopper film and the phase shift film.

21. The photomask blank of claim 14, comprising a hard mask film having an etching characteristic different from that of the light-shielding film in contact with the light-shielding film on a side remote from the substrate.

22. A photomask produced by using the photomask blank of claim 14.

* * * * *